United States Patent
Zhang et al.

(10) Patent No.: US 10,386,724 B2
(45) Date of Patent: Aug. 20, 2019

(54) HYDROPHILIC PHOTORESIST, PATTERNING METHOD OF QUANTUM DOT LAYER AND QUANTUM DOT LIGHT-EMITTING DIODE

(71) Applicant: BOE Technology Group Co., Ltd., Beijing (CN)

(72) Inventors: Bin Zhang, Beijing (CN); Tingting Zhou, Beijing (CN); Feng Zhang, Beijing (CN); Wei Zhang, Beijing (CN); Jincheng Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/313,910

(22) PCT Filed: Sep. 29, 2015

(86) PCT No.: PCT/CN2015/091031
§ 371 (c)(1),
(2) Date: Nov. 23, 2016

(87) PCT Pub. No.: WO2016/201823
PCT Pub. Date: Dec. 22, 2016

(65) Prior Publication Data
US 2017/0176863 A1 Jun. 22, 2017

(30) Foreign Application Priority Data
Jun. 16, 2015 (CN) .......................... 2015 1 0335044

(51) Int. Cl.
| | | |
|---|---|---|
| *G03F 7/40* | (2006.01) | |
| *G03F 7/038* | (2006.01) | |
| *G03F 7/039* | (2006.01) | |
| *G03F 7/16* | (2006.01) | |
| *G03F 7/20* | (2006.01) | |
| *G03F 7/26* | (2006.01) | |
| *H01L 33/00* | (2010.01) | |
| *H01L 33/06* | (2010.01) | |
| *H01L 33/28* | (2010.01) | |
| *H01L 33/30* | (2010.01) | |
| *H01L 51/00* | (2006.01) | |
| *H01L 51/50* | (2006.01) | |

(52) U.S. Cl.
CPC .............. *G03F 7/40* (2013.01); *G03F 7/038* (2013.01); *G03F 7/039* (2013.01); *G03F 7/16* (2013.01); *G03F 7/20* (2013.01); *G03F 7/26* (2013.01); *G03F 7/405* (2013.01); *H01L 33/0062* (2013.01); *H01L 33/0083* (2013.01); *H01L 33/06* (2013.01); *H01L 33/28* (2013.01); *H01L 33/30* (2013.01); *H01L 51/0018* (2013.01); *H01L 51/502* (2013.01)

(58) Field of Classification Search
CPC ....... H01L 21/3105; G03F 7/40; G03F 7/038; G03F 7/26; G03F 7/42

USPC ................................. 430/327, 331, 329, 330
See application file for complete search history.

(56) References Cited

U.S. PATENT DOCUMENTS

| | | | | |
|---|---|---|---|---|
| 4,745,042 | A | * | 5/1988 | Sasago .................. G03F 7/0215 430/156 |
| 6,465,147 | B1 | | 10/2002 | Lee et al. |
| 6,627,588 | B1 | * | 9/2003 | Hess ........................ C11D 7/06 257/E21.255 |
| 2009/0170303 | A1 | * | 7/2009 | Kim .................. H01L 21/28273 438/591 |
| 2011/0278688 | A1 | * | 11/2011 | Rennie ................... G02B 5/201 257/432 |
| 2016/0067948 | A1 | * | 3/2016 | Chang .................... B32B 17/00 428/161 |

FOREIGN PATENT DOCUMENTS

| | | |
|---|---|---|
| CN | 102043327 A | 5/2011 |
| CN | 103728837 A | 4/2014 |
| CN | 203587924 U | 5/2014 |
| CN | 104090361 A | 10/2014 |
| CN | 104297984 A | 1/2015 |
| CN | 104299973 A | 1/2015 |
| CN | 104508492 A | 4/2015 |

(Continued)

OTHER PUBLICATIONS

English Translation of JP-2013-189531, Kuroiwa et al., (Year: 2013).*
Apr. 24, 2017—(CN) First Office Action Appn 201510335044.4 with English Tran.
Feb. 25, 2016—(WO) International Search Report and Written Opinion Appn PCT/CN2015/091031 with English Tran.
Dec. 19, 2017—(CN) Second Office Action Appn 201510335044.4 with English Tran.

*Primary Examiner* — Daborah Chacko-Davis
(74) *Attorney, Agent, or Firm* — Banner & Witcoff, Ltd.

(57) ABSTRACT

A photoresist, a patterning method of a quantum dot layer, a QLED, a quantum dot color filter and a display device are disclosed, which can solve the problem that current patterning methods destroy quantum dots. The patterning method of a quantum dot layer includes the steps of: forming a hydrophilic photoresist pattern which comprises forming a photoresist material layer on a substrate by using a photoresist, patterning the photoresist material layer to form a photoresist pattern, and subjecting the photoresist to hydrophilic treatment; applying quantum dots; removing the quantum dots retained on the photoresist pattern; and stripping the photoresist pattern. The patterning method of a quantum dot layer in the present disclosure can improve the hydrophilic performance of the photoresist and reduce the adhesion of the lipophilic quantum dots on the photoresist.

10 Claims, 2 Drawing Sheets

(56) References Cited

FOREIGN PATENT DOCUMENTS

| JP | 07-207464 | * | 8/1995 | ........... H02L 21/027 |
| JP | 2013189531 | * | 9/2013 | ............... C08G 8/00 |
| WO | 2004074173 A1 | | 9/2004 | |
| WO | WO-2004074173 A1 | * | 9/2004 | ............. B82Y 30/00 |

* cited by examiner

HYDROPHILIC PHOTORESIST, PATTERNING METHOD OF QUANTUM DOT LAYER AND QUANTUM DOT LIGHT-EMITTING DIODE

The application is a U.S. National Phase Entry of International Application No. PCT/CN2015/091031 filed on Sep. 29, 2015, designating the United States of America and claiming priority to Chinese Patent Application No. 201510335044.4 filed on Jun. 16, 2015. The present application claims priority to and the benefit of the above-identified applications and the above-identified applications are incorporated by reference herein in their entirety.

TECHNICAL FIELD

Embodiments of the present disclosure relate to a hydrophilic photoresist, a patterning method of a quantum dot layer, a quantum dot light-emitting diode (OLED), a quantum dot color filter, and a display device.

BACKGROUND

A quantum dot (QD), which is also called a nanocrystal, is a nanoparticle composed of elements of Groups II and VI or elements of Groups III and V. Because electrons and holes are subject to quantum confinement, a continuous energy band structure becomes a discrete energy level structure with molecular characteristics. After being excited the quantum dot can emit fluorescence, and the luminescence spectrum can be controlled by changing the size of the quantum dot. With good fluorescence intensity and stability, quantum dots are good electroluminescent materials.

At present, quantum dots have been widely used in the display field as display materials. For example, by using quantum dots as light-emitting materials in a light-emitting layer, a quantum dot light-emitting diode has been manufactured.

The inventors have found that at least the following problems exist in the prior art: because quantum dots are not small molecular organic materials, there is currently no quantum dot patterning method suitable for mass production.

At the same time, patterning cannot be conducted by means of evaporation and ink jetting. At present, a generally accepted method in the industry is a transfer printing method, which is yet immature, involves great technical difficulty, and currently cannot be used for mass production. In addition, there are quite few suppliers for transfer printing equipment, which restricts the development of QLED.

SUMMARY

Embodiments of the present disclosure provide a patterning method of a quantum dot layer to solve the problem that current patterning methods would destroy quantum dots.

The technical solution used to solve the problem is:

a patterning method of a quantum dot layer, comprising the steps of:

forming a photoresist material layer on a substrate, patterning the photoresist, and subjecting the photoresist to hydrophilic treatment;

applying quantum dots;

removing the quantum dots remaining (retained) on the photoresist; and stripping the photoresist.

There is no limitation on the order of the steps of forming a photoresist material layer on a substrate, patterning the photoresist, and subjecting the photoresist to hydrophilic treatment.

Subjecting the photoresist to hydrophilic treatment may be carried out after forming a photoresist material layer on a substrate but before patterning the photoresist, or be carried out after forming a photoresist material layer on a substrate and patterning the photoresist.

The steps of forming a photoresist material layer on a substrate, patterning the photoresist, and subjecting the photoresist to hydrophilic treatment together lead to a pattern of hydrophilic photoresist. The pattern of hydrophilic photoresist precisely exposes a region required to be coated with quantum dots on the substrate.

In some embodiments, subjecting the photoresist to hydrophilic treatment is carried out before forming a photoresist material layer, wherein forming a photoresist material layer on a substrate and subjecting the photoresist to hydrophilic treatment comprise:

mixing the photoresist with a hydrophilic dialdehyde to obtain a hydrophilic photoresist containing a hydrophilic group; and patterning after forming the above hydrophilic photoresist material layer on the substrate.

In some embodiments, a content of the hydrophilic dialdehyde in the hydrophilic photoresist is from about 1 wt. % to about 20 wt. %.

In some embodiments, subjecting the photoresist to hydrophilic treatment is carried out after forming a photoresist material layer, wherein subjecting the photoresist to hydrophilic treatment comprises:

preparing an aqueous solution of a hydrophilic dialdehyde containing an acid, wherein the hydrophilic dialdehyde contains a hydrophilic group;

soaking the substrate which has been provided with the photoresist material layer in the aqueous solution; and heating the substrate to form a hydrophilic group on the surface of the photoresist.

In some embodiments, the acid is one or more selected from the group consisting of an oxalic acid, a maleic acid, a maleic acid anhydride, an acetic acid, a trichloroacetic acid, a benzenesulfonic acid, a tartaric acid, a citric acid and a racemic malic acid.

In some embodiments, the aqueous solution of the hydrophilic dialdehyde has a mass concentration of from about 3% to about 20%, and a pH of from about 2 to about 5.5.

In some embodiments, the soaking time is from about 5 min to about 30 min.

In some embodiments, heating the substrate comprises: heating at a temperature of about 90° C. to about 160° C. for about 5 minutes to about 60 minutes.

In some embodiments, the hydrophilic dialdehyde has a formula of:

wherein R is a hydrophilic group, $n_1$ is 0 or a positive integer, $n_2$ is a positive integer, $n_3$ is 0 or a positive integer, $n_4$ is a positive integer, and $(n_1+n_2+n_3)*n_4=3$ to 10.

In some embodiments, the hydrophilic group is one or more selected from the group consisting of a carboxyl group, a carboxylic salt, a hydroxyl group, an amino group, a quaternary ammonium salt, an ester group, a hydrazide group, an amide group, and a sulfonic acid group.

In some embodiments, the photoresist comprises a phenolic resin.

In some embodiments, the method further comprises processing the substrate by anchoring quantum dots, prior to formation of the photoresist material layer on the substrate. The process of anchoring quantum dots improves the adhesion of the substrate to quantum dots.

Embodiments of the present disclosure provide a method for preparing a hydrophilic dialdehyde; the synthesis of the 2-ethanol-adipaldehyde comprises: using 3-cyclohexene-1-methanol (CAS: 1679-51-2) as a raw material to generate 2-ethanol-adipaldehyde, a hydrophilic dialdehyde, through three steps of reaction. The reaction process is as follows:

The above method for preparing a hydrophilic dialdehyde is only exemplary. Those skilled in the art can use other similar raw materials to prepare the hydrophilic dialdehyde containing a hydrophilic group according to their experience.

Embodiments of the present disclosure further provide a photoresist for patterning quantum dots, wherein the photoresist comprises a hydrophilic group.

Embodiments of the present disclosure further provide a quantum dot light-emitting diode (QLED) comprising a light-emitting layer, wherein the light-emitting layer comprises a quantum dot layer prepared by the above-mentioned patterning method.

Embodiments of the present disclosure further provide a quantum dot color filter comprising a quantum dot layer prepared by the above-mentioned patterning method.

Embodiments of the present disclosure further provide a display device comprising the above QLED or quantum dot color filter.

The patterning method of a quantum dot layer according to the embodiments of the present disclosure comprises subjecting the photoresist to hydrophilic treatment, which can improve the hydrophilic performance of the photoresist. Because quantum dots are lipophilic, the adhesion of quantum dots on the photoresist is extremely low. Upon stripping the photoresist, the quantum dots on the target position of the substrate will not drop. The patterning method of a quantum dot layer according to the embodiments of the present disclosure is suitable for manufacturing a light-emitting diode containing quantum dots.

BRIEF DESCRIPTION OF THE DRAWINGS

In order to clearly illustrate the technical solution of the embodiments of the present disclosure, the drawings of the embodiments will be briefly described as follows. Apparently, the described drawings only relate to some embodiments of the present disclosure and thus the present disclosure is not limited thereto.

In the drawings, the reference signs have the following meanings: 1. substrate; 2. photoresist; 3. quantum dot; 31. light-emitting core; 32. semiconductor shell; 33. organic ligand.

DETAILED DESCRIPTION

In order to make objects, technical solutions and advantages of the embodiments of the disclosure clearer, the technical solutions of the embodiments of the present disclosure will be described in a clear and complete way in connection with the drawings related to the embodiments of the disclosure. Apparently, the described embodiments are just part but not all of the embodiments of the disclosure. Based on the described embodiments herein, those skilled in the art can obtain all the other embodiments without any inventive work, all of which belong to the protection scope of the disclosure.

Figure 1:
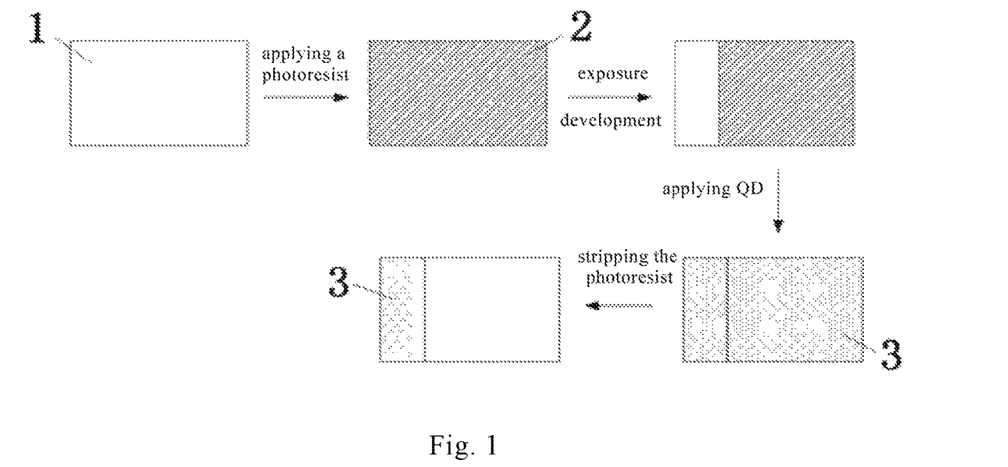
FIG. 1 is a schematic diagram of the steps of the current patterning method of a quantum dot layer.

FIG. 1 shows a patterning method of a quantum dot layer, which comprises: applying a photoresist 2 on a substrate 1 and exposing the photoresist 2, and then applying a whole layer of quantum dots 3 on the above substrate 1, wherein the quantum dots 3 at a region having no photoresist 2 on the substrate 1 need to be retained. Because the binding force between the quantum dots 3 and the photoresist 2 is strong, if the quantum dots 3 on the photoresist 2 are directly cleaned, then the quantum dots 3 at the region having no photoresist 2 on the substrate 1 will also be washed off. Furthermore, because of a complete layer of quantum dots 3, if the photoresist 2 is to be directly stripped, then the photoresist 2 underneath the quantum dots 3 cannot be stripped due to being incapable of contacting the stripping fluid.

In the present disclosure, if a substance is described as "hydrophilic", it means that the contact angle between the substance and water is less than 40°. For example, in the present disclosure, hydrophilic treatment means that the contact angle between the treated photoresist and water is less than 40°. In some embodiments, the contact angle between the photoresist subjected to hydrophilic treatment and water is less than or equal to 35°.

In the present disclosure, if a substance is described as "hydrophobic" or "lipophilic", it means that the contact angle between the substance and water is greater than 40°. For example, in the present disclosure, because the quantum dots have lipophilic groups (or hydrophobic groups) on their surface, the contact angle between the quantum dots and water is greater than about 40°. In some embodiments, the contact angle between the quantum dots and water is greater than or equal to about 45°.

In the present disclosure, the term "hydrophilic photoresist pattern" means that the surface of the photoresist pattern is hydrophilic. Because the surface of the photoresist pattern is hydrophilic, the adhesion between the quantum dots whose surface is hydrophobic (or lipophilic) and the photoresist is low, which leads to easy removal of the quantum dots from the surface of the photoresist pattern.

The present disclosure provides the following embodiments:

Embodiment 1: a patterning method of a quantum dot layer, comprising:
forming a hydrophilic photoresist pattern, which comprises:
forming a photoresist material layer on a substrate by using a photoresist,
patterning the photoresist material layer to form a photoresist pattern, and
subjecting the photoresist to hydrophilic treatment; applying quantum dots;
removing the quantum dots retained on the photoresist pattern; and stripping the photoresist pattern.

Embodiment 2: the patterning method of a quantum dot layer according to Embodiment 1, wherein the subjecting the photoresist to hydrophilic treatment is carried out prior to the forming a photoresist material layer;
the forming a hydrophilic photoresist pattern comprises:
mixing the photoresist with a hydrophilic dialdehyde to obtain a hydrophilic photoresist containing a hydrophilic group;
forming the hydrophilic photoresist material layer on the substrate; and
patterning the hydrophilic photoresist material layer to form a photoresist pattern.

Embodiment 3: the patterning method of a quantum dot layer according to Embodiment 2, wherein a content of the hydrophilic dialdehyde in the hydrophilic photoresist is from about 1 wt. % to about 20 wt. %.

Embodiment 4: the patterning method of a quantum dot layer according to Embodiment 1, wherein the subjecting the photoresist to hydrophilic treatment is carried out after the forming a photoresist material layer;
the subjecting the photoresist to hydrophilic treatment comprises:
preparing an aqueous solution of a hydrophilic dialdehyde containing an acid, wherein the hydrophilic dialdehyde contains a hydrophilic group;
soaking the substrate which has been provided with the photoresist material layer in the aqueous solution; and
heating the substrate to form a hydrophilic group on the surface of the photoresist material layer.

Embodiment 5: the patterning method of a quantum dot layer according to Embodiment 4, wherein the acid is selected from the group consisting of an oxalic acid, a maleic acid, a maleic acid anhydride, an acetic acid, a trichloroacetic acid, a benzenesulfonic acid, a tartaric acid, a citric acid and a racemic malic acid.

Embodiment 6: the patterning method of a quantum dot layer according to Embodiment 4 or 5, wherein the aqueous solution of the hydrophilic dialdehyde has a mass concentration of from about 3 wt. % to about 20 wt. %, and a pH of from about 2 to about 5.5.

Embodiment 7: the patterning method of a quantum dot layer according to any one of Embodiments 4 to 6, wherein the soaking time is from about 5 minutes to about 30 minutes.

Embodiment 8: the patterning method of a quantum dot layer according to Embodiment 4, wherein the heating the substrate comprises: heating at a temperature of about 90° C. to about 160° C. for about 5 minutes to about 60 minutes, for example, heating at a temperature of about 90° C. to about 100° C. for about 5 minutes to about 60 minutes.

Embodiment 9: the patterning method of a quantum dot layer according to Embodiment 2 or 4, wherein the hydrophilic dialdehyde has a formula of:

wherein R is a hydrophilic group, $n_1$ is 0 or a positive integer, $n_2$ is a positive integer, $n_3$ is 0 or a positive integer, $n_4$ is a positive integer, and $(n_1+n_2+n_3)*n_4=3$ to 10.

Embodiment 10: the patterning method of a quantum dot layer according to any one of Embodiments 2 to 9, wherein the hydrophilic group is selected from the group consisting of a carboxyl group, a carboxylic salt, a hydroxyl group, an amino group, a quaternary ammonium salt, an ester group, a hydrazide group, an amide group, and a sulfonic acid group.

Embodiment 11: the patterning method of a quantum dot layer according to any one of Embodiments 1 to 10, wherein the photoresist comprises a phenolic resin.

Embodiment 12: the patterning method of a quantum dot layer according to Embodiment 1, wherein the method further comprises processing the substrate by anchoring quantum dots prior to formation of the photoresist material layer.

Processing the substrate by anchoring quantum dots includes treating the substrate with a silane coupling agent.

The silane coupling agent is a kind of organic silicon compounds containing two different chemical groups in a molecule, and has a general formula of $YSiX_3$. In the formula, Y is a non-hydrolytic group, including an alkenyl (for example vinyl), or an alkyl whose end has a functional group of Cl, $NH_2$, SH, epoxy, $N_3$, (meth)acryloxy, or isocyanate, etc., i.e., Y is a carbon functional group. X is a hydrolyzable group, including Cl, OMe, OEt, $OC_2H_4OCH_3$, $OSiMe_3$, or OAc, etc. Because the silane coupling agent has a reactive group capable of being chemically bound with inorganic materials (such as glass, silica, and metal) and a reactive group capable of being chemically bound with organic materials (such as synthetic resin) in its molecular, it can be used for the surface treatment.

Before treating with a silane coupling agent, the silane coupling agent is formulated as a dilute solution with a concentration of 0.5~1%. The dilute solution of the silane coupling agent is applied on a clean surface to be coated, and upon drying, glue can be applied. The solvent used may be water, an alcohol (for example, methanol if methoxy silanes are used, and ethanol if ethoxy silanes are used), or a mixture thereof. In some embodiments, the solvent used is selected from water without fluorine ion, cheap and non-toxic ethanol, and isopropanol. When the silane coupling agent does not contain aminoalkyl silane, the formulated solution of the silane coupling agent may include acetic acid as a hydrolysis catalyst, and the pH may be adjusted to 3.5~5.5.

For example, the method for anchoring quantum dots comprises placing the substrate in a steam of hexamethyl disilazane (HMDS), heating to 100° C. to 180° C. for 20 min to 120 min, then taking it out for cooling.

Embodiment 13: the patterning method of a quantum dot layer according to Embodiment 1, wherein the photoresist pattern precisely exposes a region required to be coated with quantum dots on the substrate.

Embodiment 14: a photoresist for patterning a quantum dot layer, wherein the photoresist comprises a hydrophilic group which is derived from a hydrophilic dialdehyde.

Embodiment 15: the photoresist for patterning a quantum dot layer according to Embodiment 14, wherein the hydrophilic dialdehyde has a formula of:

wherein R is a hydrophilic group, $n_1$ is 0 or a positive integer, $n_2$ is a positive integer, $n_3$ is 0 or a positive integer, $n_4$ is a positive integer, and $(n_1+n_2+n_3)*n_4=3$ to 10.

Embodiment 16: the photoresist for patterning a quantum dot layer according to Embodiment 14 or 15, wherein the hydrophilic group is selected from the group consisting of a carboxyl group, a carboxylic salt, a hydroxyl group, an amino group, a quaternary ammonium salt, an ester group, a hydrazide group, an amide group, and a sulfonic acid group.

Embodiment 17: a quantum dot light-emitting diode (QLED), comprising a light-emitting layer, wherein the light-emitting layer comprises a quantum dot layer prepared by the patterning method of a quantum dot layer according to any one of Embodiments 1 to 13.

Embodiment 18: a quantum dot color filter, comprising a quantum dot layer prepared by the patterning method of a quantum dot layer according to any one of Embodiments 1 to 13.

Embodiment 19: a display device, comprising the QLED according to Embodiment 17 or the quantum dot color filter according to Embodiment 18.

EXAMPLES

The examples of the present disclosure will be described in connection with the drawings.

Example 1

The example provides a patterning method of a quantum dot layer, comprising: forming a photoresist material layer on a substrate by using a photoresist, patterning the photoresist layer to form a photoresist pattern, and subjecting the photoresist to hydrophilic treatment;
applying quantum dots;
removing the quantum dots retained on the photoresist pattern; and
stripping the photoresist pattern.

There is no limitation on the order of the steps of forming a photoresist material layer on a substrate, patterning the photoresist, and subjecting the photoresist to hydrophilic treatment.

The subjecting the photoresist to hydrophilic treatment may be carried out after forming a photoresist material layer on a substrate but before patterning the photoresist, or be carried out after forming a photoresist material layer on a substrate and patterning the photoresist.

The patterning method of a quantum dot layer of the present example comprises subjecting the photoresist to hydrophilic treatment, which can improve the hydrophilic performance of the photoresist. Because quantum dots are lipophilic (or hydrophobic), the adhesion of quantum dots on the photoresist is extremely low. Upon stripping the photoresist, the quantum dots at the target position of the substrate will not drop. The target position refers to the region of the substrate required to be coated with quantum dots. The patterning method of a quantum dot layer in the example of the present disclosure is suitable for manufacturing a light-emitting diode including quantum dots.

Example 2

Figure 2:
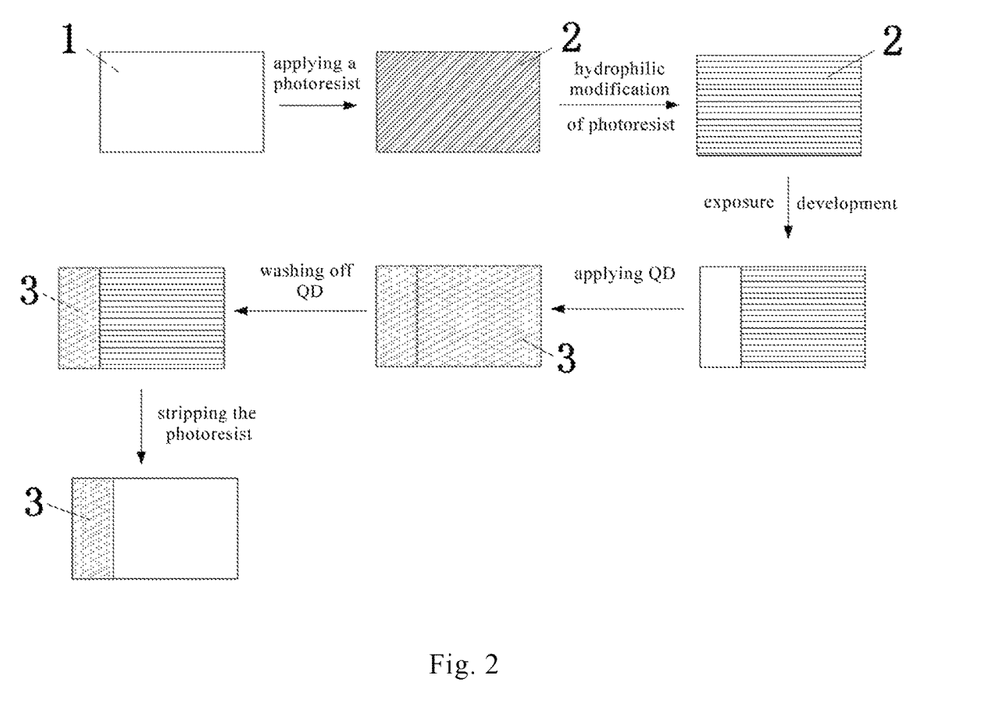
FIG. 2 is a schematic diagram of the steps of one patterning method of a quantum dot layer in Example 2 of the present disclosure.
Figure 3:
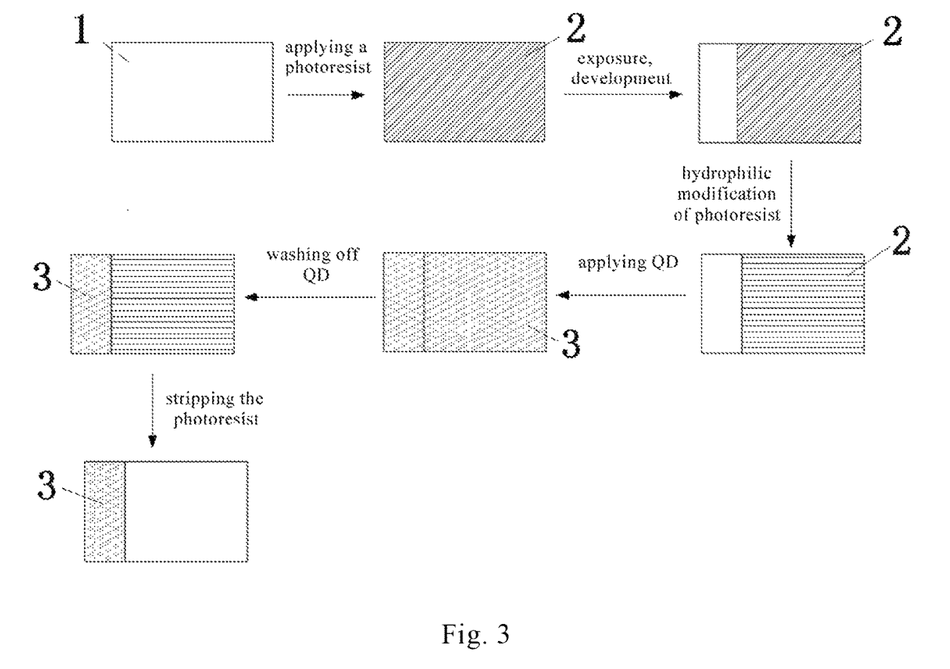
FIG. 3 is a schematic diagram of the steps of another patterning method of a quantum dot layer in Example 2 of the present disclosure.
Figure 4:
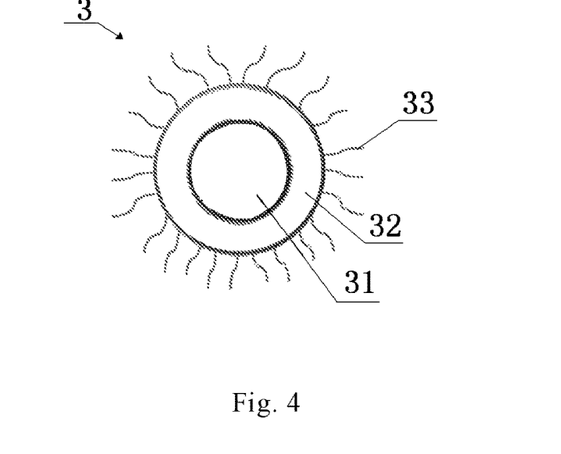
FIG. 4 is a schematic structure diagram of the quantum dots in Example 2 of the present disclosure.

The example provides a patterning method of a quantum dot layer, as shown in FIG. 2 to FIG. 4, comprising:
forming a photoresist 2 material layer on a substrate 1, patterning the photoresist 2 to form a photoresist pattern, and subjecting the photoresist 2 to hydrophilic treatment;
applying quantum dots 3;
removing the quantum dots retained on the photoresist pattern; and
stripping the photoresist 2.

In other words, the photoresist 2 is subjected to hydrophilic treatment in this example so as to improve the hydrophilic performance of the photoresist 2.

The schematic structure diagram of the quantum dot 3 is as shown in FIG. 4, and the quantum dot 3 includes three parts: a luminescent core 31, a semiconductor shell 32, and an organic ligand 33, respectively. The organic ligand 33 comprises a lipophilic group, such as a group derived from oleyl amine ($CH_3(CH_2)_7CH=CH(CH_2)_7CH_2NH_2$) or oleic acid ($CH_3(CH_2)_7CH=CH(CH_2)_7COOH$). Because quantum dots 3 are lipophilic, the adhesion of the quantum dots 3 on the photoresist 2 is extremely low. Upon removing the quantum dots from the photoresist pattern and stripping the photoresist 2, the quantum dots 3 at the target position of the substrate 1 will not drop. The patterning method of a quantum dot layer in the example of the present disclosure is suitable for manufacturing a light-emitting diode display including quantum dots.

In some embodiments, the subjecting the photoresist 2 to hydrophilic treatment is carried out after forming a photoresist 2 material layer; the subjecting the photoresist 2 to hydrophilic treatment comprises:
preparing an aqueous solution of a hydrophilic dialdehyde containing an acid, wherein the hydrophilic dialdehyde contains a hydrophilic group;
soaking the substrate 1 on which the photoresist 2 material layer has been formed in the aqueous solution of a hydrophilic dialdehyde containing an acid; and
heating the substrate 1 to form a hydrophilic group on the surface of the photoresist 2 material layer.

In other words, as an embodiment of the present example, the surface of the photoresist 2 can be modified to be hydrophilic, so as to reduce the adhesion of the quantum dots 3 on the photoresist 2.

Patterning manners are exemplified by exposure and development. As illustrated in FIG. 2, the photoresist 2 is first subjected to hydrophilic treatment, and then exposed and developed to form a hydrophilic photoresist pattern, followed by applying quantum dots 3, then washing off the quantum dots 3 retained on the surface of the photoresist 2, and finally stripping the photoresist 2. Alternatively, as illustrated in FIG. 3, the photoresist 2 is first exposed and developed, and then subjected to hydrophilic treatment followed by applying quantum dots 3, then washing off the quantum dots 3 retained on the surface of the photoresist 2, and finally stripping the photoresist 2.

In some embodiments, the acid is selected from the group consisting of an oxalic acid, a maleic acid, a maleic acid anhydride, an acetic acid, a trichloroacetic acid, a benzene-sulfonic acid, a tartaric acid, a citric acid and a racemic malic acid.

In other words, the aqueous solution of the hydrophilic dialdehyde can be prepared by using any of the above acids.

In some embodiments, the aqueous solution of the hydrophilic dialdehyde has a mass concentration of from about 3% to about 20%, and a pH of from about 2 to about 5.5.

In other words, an acid is used to adjust the aqueous solution of the hydrophilic dialdehyde so as to have a mass concentration of from about 3% to about 20% and a pH of from about 2 to about 5.5.

In some embodiments, the soaking time is from about 5 minutes to 30 minutes.

In other words, soaking for about 5 minutes to about 30 minutes can ensure a sufficient contact between the photoresist on the surface and the aqueous solution of the hydrophilic dialdehyde.

In some embodiments, heating the substrate comprises: heating at a temperature of about 90° C. to about 160° C. for about 5 minutes to about 60 minutes.

In other words, heating at a temperature of about 90° C. to about 160° C. for about 5 minutes to about 60 minutes can ensure a sufficient reaction between the photoresist 2 on the surface and the aqueous solution of the hydrophilic dialdehyde.

In some embodiments, the hydrophilic dialdehyde has a formula of:

wherein R is a hydrophilic group, $n_1$ is 0 or a positive integer, $n_2$ is a positive integer, $n_3$ is 0 or a positive integer, $n_4$ is a positive integer, and $(n_1+n_2+n_3)*n_4=3$ to 10.

The example of the present disclosure provides a method for preparing a hydrophilic dialdehyde (2-ethanol-adipaldehyde) which comprises: using 3-cyclohexene-1-methanol (CAS:1679-51-2) as a raw material to generate hydrophilic dialdehyde 2-ethanol-adipaldehyde through three steps of reaction. The reaction process is as follows:

In some embodiments, the hydrophilic group includes one or more selected from the group consisting of a carboxyl group, a carboxylic salt, a hydroxyl group, an amino group, a quaternary ammonium salt, an ester group, a hydrazide group, an amide group, and a sulfonic acid group.

In other words, those skilled in the art can synthesize the hydrophilic dialdehyde by selecting different raw materials having the above hydrophilic group(s) according to their experience.

In some embodiments, the photoresist comprises a phenolic resin.

In other words, a linear phenolic resin is reacted with a hydrophilic dialdehyde to form a network phenolic resin, so that a hydrophilic group is introduced into the phenolic resin.

In some embodiments, prior to forming a photoresist 2 material layer on the substrate 1, the substrate 1 is further processed by anchoring quantum dots.

In other words, in order to increase the adhesion of the quantum dots 3 at the target position of the substrate 1, the substrate 1 is processed by anchoring quantum dots 3 prior to applying the photoresist 2 on the substrate 1.

In some embodiments, as another manner of the example, subjecting the photoresist 2 to hydrophilic treatment can be carried out prior to forming a photoresist 2 material layer. Forming a photoresist 2 material layer on a substrate 1 and subjecting the photoresist 2 to hydrophilic treatment comprise:

mixing the photoresist 2 with a hydrophilic dialdehyde to obtain a hydrophilic photoresist containing a hydrophilic group; and forming a hydrophilic photoresist 2 material layer on the substrate 1.

In other words, the photoresist 2 can be modified for incorporation of a hydrophilic group so as to reduce the adhesion of the quantum dots 3 on the photoresist 2.

In some embodiments, the content of the hydrophilic dialdehyde in the hydrophilic photoresist is from about 1 wt. % to about 20 wt. %.

In other words, in the mixed solution of the photoresist 2 and the hydrophilic dialdehyde, the hydrophilic dialdehyde has a concentration of from about 1 wt. % to about 20 wt. %.

Example 3

The example provides a photoresist for patterning a quantum dot layer, the photoresist comprising a hydrophilic group which is derived from a hydrophilic dialdehyde.

In some embodiments, the hydrophilic dialdehyde has a formula of:

wherein R is a hydrophilic group, $n_1$ is 0 or a positive integer, $n_2$ is a positive integer, $n_3$ is 0 or a positive integer, $n_4$ is a positive integer, and $(n_1+n_2+n_3)*n_4=3$ to 10. The hydrophilic group is selected from the group consisting of a carboxyl group, a carboxylic salt, a hydroxyl group, an amino group, a quaternary ammonium salt, an ester group, a hydrazide group, an amide group, and a sulfonic acid group.

In a specific embodiment, the dialdehyde is 2-ethanol-adipaldehyde. 2-ethanol-adipaldehyde is synthesized by the following method: using 3-cyclohexene-1-methanol (CAS: 1679-51-2) as a raw material to generate hydrophilic dialdehyde (2-ethanol-adipaldehyde) through three steps of reaction. The reaction process is as follows:

Example 4

The example provides a QLED which comprises the quantum dot layer prepared by the patterning method in Example 2.

In some embodiments, QLED further comprises a cathode, an anode, and an electron injection layer, an electron transport layer, a hole blocking layer, a hole transport layer and a hole injection layer disposed between the cathode and the anode. The quantum dot layer prepared by the patterning method in Example 2, as a light-emitting layer, is arranged between the hole blocking layer and the hole transport layer.

Example 5

The example provides a quantum dot color filter comprising a quantum dot layer prepared by the patterning method in Example 2.

Example 6

The example further provides a display device comprising the QLED according to Example 4 or the quantum dot color filter according to Example 5.

Obviously, the above embodiments of various examples can undergo many changes. For example, other similar raw materials can be used to prepare a hydrophilic dialdehyde containing a hydrophilic group for modifying a photoresist, or the organic layer of the QLED can be modified depending upon actual needs.

The above are merely exemplary embodiments of the present invention, and are not intended to limit the scope of protection of the present invention, which is yet determined by the appended claims.

The present application claims the priority of the Chinese Patent Application No. 201510335044.4 filed on Jun. 16, 2015, which is incorporated herein by reference as part of the disclosure of the present application.

What is claimed is:

1. A method for patterning a quantum dot layer onto a substrate, comprising:
   forming a hydrophilic photoresist pattern, comprising:
      forming a photoresist material layer on the substrate by using a photoresist which comprises a phenolic resin, patterning the photoresist material layer to form a photoresist pattern, and
      subjecting the photoresist to a hydrophilic treatment by contacting the photoresist with a hydrophilic dialdehyde which has a formula of:

wherein R is a hydrophilic group selected from the group consisting of a carboxyl group, a carboxylic salt, a hydroxyl group, an amino group, a quaternary ammonium salt, an ester group, an ester group, a hydrazide group, an amide group, and a sulfonic acid group, $n_1$ is 0 or a positive integer, $n_2$ is a positive integer, $n_3$ is 0 or a positive integer, $n_4$ is a positive integer, and $(n_1+n_2+n_3)*n_4=3$ to 10;

forming a layer of quantum dots by applying a quantum dot solution onto the substrate on which the hydrophilic photoresist pattern has been formed;

removing quantum dots retained on the photoresist pattern; and stripping the photoresist pattern.

2. The method for patterning the quantum dot layer according to claim 1, wherein the subjecting the photoresist to the hydrophilic treatment is carried out prior to the forming the photoresist material layer, the forming the hydrophilic photoresist pattern further comprising:
   mixing the photoresist with the hydrophilic dialdehyde to obtain a hydrophilic photoresist containing the hydrophilic group,
   wherein the forming the photoresist material layer on the substrate comprises forming a hydrophilic photoresist material layer on the substrate, and
   wherein the patterning the photoresist material layer to form the photoresist pattern comprises patterning the hydrophilic photoresist material layer to form the photoresist pattern.

3. The method for patterning the quantum dot layer according to claim 2, wherein a content of the hydrophilic dialdehyde in the hydrophilic photoresist is from about 1 wt % to about 20 wt %.

4. The method for patterning the quantum dot layer according to claim 1, wherein the subjecting the photoresist to the hydrophilic treatment is carried out after the forming the photoresist material layer, the subjecting the photoresist to the hydrophilic treatment comprising:
   preparing an aqueous solution of hydrophilic dialdehyde containing an acid;
   soaking the substrate on which the photoresist material layer is formed in the aqueous solution; and
   heating the substrate to form the hydrophilic group on a surface of the photoresist material layer.

5. The method for patterning the quantum dot layer according to claim 4, wherein the acid is selected from the group consisting of an oxalic acid, a maleic acid, a maleic acid anhydride, an acetic acid, a trichloroacetic acid, a benzenesulfonic acid, a tartaric acid, a citric acid, and a racemic malic acid.

6. The method for patterning the quantum dot layer according to claim 4, wherein the aqueous solution of the hydrophilic dialdehyde has a mass concentration of from about 3 wt % to about 20 wt %, and a pH of from about 2 to about 5.5.

7. The method for patterning the quantum dot layer according to claim 4, wherein the soaking the substrate comprises soaking the substrate for about 5 min to about 30 min.

8. The method for patterning the quantum dot layer according to claim 4, wherein the heating the substrate comprises: heating at a temperature of about 90° C. to about 160° C. for about 5 min to about 60 min.

9. The method for patterning the quantum dot layer according to claim 1, wherein the method further comprises treating the substrate with a silane coupling agent prior to formation of the photoresist material layer.

10. The method for patterning the quantum dot layer according to claim 1, wherein the photoresist pattern precisely exposes a region required to be coated with quantum dots on the substrate.

* * * * *